United States Patent [19]

Tanahashi et al.

[11] 4,107,652
[45] Aug. 15, 1978

[54] ERROR CORRECTING AND CONTROLLING SYSTEM

[75] Inventors: Jun'ichi Tanahashi, Yamato; Takashi Kanie, Tama, both of Japan

[73] Assignee: Fujitsu Limited, Kawasaki, Japan

[21] Appl. No.: 753,786

[22] Filed: Dec. 23, 1976

[30]  · Foreign Application Priority Data

Dec. 27, 1975 [JP] Japan .............................. 50-157516
Dec. 29, 1975 [JP] Japan .............................. 50-157727
Dec. 30, 1975 [JP] Japan .............................. 50-156829

[51] Int. Cl.² ...................... G08C 25/00; G06F 11/12
[52] U.S. Cl. .......................................... 340/146.1 AL
[58] Field of Search ............................ 340/146.1 AL

[56] References Cited

U.S. PATENT DOCUMENTS

| 3,478,313 | 11/1969 | Srinivasan .................. 340/146.1 AL |
| 3,562,709 | 2/1971 | Srinivasan .................. 340/146.1 AL |
| 3,983,536 | 9/1976 | Telfer ......................... 340/146.1 AL |
| 4,030,067 | 6/1977 | Howell et al. ............. 340/146.1 AL |

*Primary Examiner*—Jerry Smith
*Attorney, Agent, or Firm*—Staas & Halsey

[57] ABSTRACT

An error correcting and controlling system having syndrome generating means for generating syndromes of data to be checked and memory means for storing error bit positions in which system the syndromes form addressing inputs to the memory so that the error bit position information stored in the address positions corresponding to each syndrome in the memory may be read out and processed for the purposes of error detection and correction. As a result, the check circuits of the present system have been simplified as compared with conventional check circuits.

12 Claims, 12 Drawing Figures

Fig. 1

$$H = \begin{pmatrix} \alpha^0, \alpha^1, \alpha^2, \alpha^3, \alpha^4, \alpha^5, \alpha^6, \alpha^7, \alpha^8, \alpha^9, \alpha^{10}, \alpha^{11}, \alpha^{12}, \alpha^{13}, \alpha^{14} \\ \alpha^0, \alpha^3, \alpha^6, \alpha^9, \alpha^{12}, \alpha^0, \alpha^3, \alpha^6, \alpha^9, \alpha^{12}, \alpha^0, \alpha^3, \alpha^6, \alpha^9, \alpha^{12} \end{pmatrix}$$

Fig. 2

$$H = \begin{pmatrix} 1 & 1 & 1 & 1 & 1 & 1 & 1 & 1 & 1 & 1 & 1 & 1 & 1 & 1 & 1 & 1 \\ 0 & \alpha^0 & \alpha^1 & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} \\ 0 & \alpha^0 & \alpha^3 & \alpha^6 & \alpha^9 & \alpha^{12} & \alpha^0 & \alpha^3 & \alpha^6 & \alpha^9 & \alpha^{12} & \alpha^0 & \alpha^3 & \alpha^6 & \alpha^9 & \alpha^{12} \end{pmatrix}$$

Fig. 3

$$H = \left[\begin{array}{cccccccccccccccc} 1 & 1 & 1 & 0 & 0 & 1 & 0 & 0 & 0 & 1 & 1 & 1 & 1 & 1 & 0 & 1 \\ 0 & 1 & 0 & 0 & 0 & 1 & 0 & 0 & 1 & 1 & 0 & 1 & 0 & 1 & 1 & 1 \\ 0 & 0 & 1 & 0 & 0 & 1 & 1 & 0 & 1 & 0 & 1 & 1 & 1 & 1 & 0 & 0 \\ 0 & 0 & 0 & 1 & 0 & 0 & 1 & 1 & 0 & 1 & 0 & 1 & 1 & 1 & 1 & 0 \\ 0 & 0 & 0 & 0 & 1 & 0 & 0 & 1 & 1 & 0 & 1 & 0 & 1 & 1 & 1 & 1 \\ \hline 0 & 1 & 0 & 0 & 0 & 1 & 1 & 0 & 0 & 0 & 1 & 1 & 0 & 0 & 0 & 1 \\ 0 & 0 & 0 & 0 & 1 & 1 & 0 & 0 & 0 & 1 & 1 & 0 & 0 & 0 & 1 & 1 \\ 0 & 0 & 0 & 1 & 0 & 1 & 0 & 0 & 1 & 0 & 1 & 0 & 0 & 1 & 0 & 1 \\ 0 & 0 & 1 & 1 & 1 & 1 & 0 & 1 & 1 & 1 & 1 & 0 & 1 & 1 & 1 & 1 \end{array}\right]$$

Fig. 6

| ADDRESS | | | | | | | | DATA | | | | | | | |
|---|---|---|---|---|---|---|---|---|---|---|---|---|---|---|---|
| $S_8$ | $S_7$ | $S_6$ | $S_5$ | $S_4$ | $S_3$ | $S_2$ | $S_1$ | A | | | | B | | | |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 1 | 0 | 0 | 0 | 0 | 0 | 0 | 0 |
| 0 | 0 | 0 | 0 | 0 | 0 | 1 | 0 | 0 | 1 | 0 | 0 | 0 | 0 | 0 | 0 |
| 0 | 0 | 0 | 0 | 0 | 0 | 1 | 1 | 1 | 0 | 0 | 0 | 0 | 1 | 0 | 0 |
| 0 | 0 | 0 | 0 | 0 | 1 | 0 | 0 | 1 | 1 | 0 | 0 | 0 | 0 | 0 | 0 |
| 0 | 0 | 0 | 0 | 0 | 1 | 0 | 1 | 1 | 0 | 0 | 0 | 1 | 1 | 0 | 0 |
| 0 | 0 | 0 | 0 | 0 | 1 | 1 | 0 | 0 | 1 | 0 | 0 | 1 | 1 | 0 | 0 |
| 0 | 0 | 0 | 0 | 0 | 1 | 1 | 1 | 0 | 0 | 0 | 0 | 0 | 0 | 0 | 0 |
| 0 | 0 | 0 | 0 | 1 | 0 | 0 | 0 | 0 | 0 | 1 | 0 | 0 | 0 | 0 | 0 |
| 1 | 1 | 1 | 1 | 1 | 1 | 0 | 1 | 1 | 1 | 0 | 1 | 0 | 0 | 1 | 1 |
| 1 | 1 | 1 | 1 | 1 | 1 | 1 | 0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 |

Fig. 10
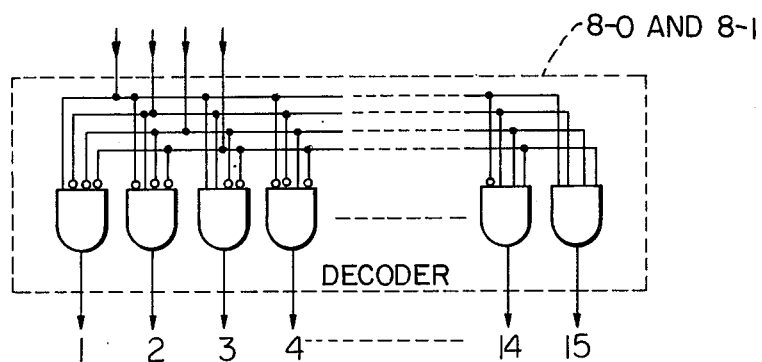
Fig. 11
| ROM ADDRESS | DATA |
|---|---|
| $S_8 S_7 S_6 \; S_5 S_4 S_3 \; S_2 S_1$ | A |
| 0 0 0 0 0 0 0 0 | 0 0 0 0 |
| 0 0 0 0 0 0 0 1 | 0 1 1 0 |
| 0 0 0 0 0 0 1 0 | 0 0 1 1 |
| 0 0 0 0 0 0 1 1 | 0 1 0 1 |
| 0 0 0 0 0 1 0 0 | 1 1 0 1 |
| 0 0 0 0 0 1 0 1 | 0 0 0 1 |
| 1 0 0 1 0 0 1 1 | 1 0 0 0 |
| 1 1 1 1 1 1 1 0 | 0 0 0 0 |
| 1 1 1 1 1 1 1 1 | 0 0 0 0 |
Fig. 12
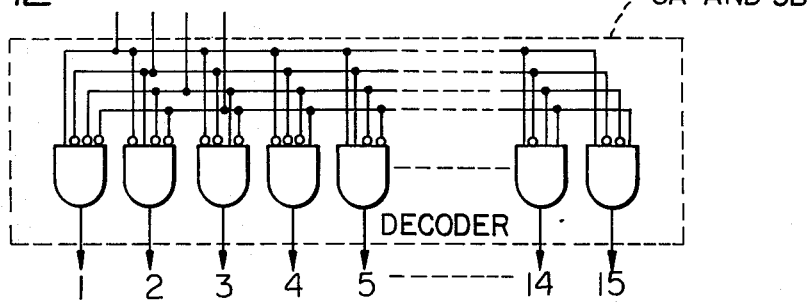

ERROR CORRECTING AND CONTROLLING SYSTEM

BACKGROUND OF THE INVENTION

The present invention relates to an error correcting and controlling system. More particularly, in a data transmission system in which an error correcting code is added to data to automatically correct random $t$-bit errors ($t \geq 2$) and detect ($t+1$)-bit errors, the invention relates to an error correcting and controlling system comprising a memory for storing error bit positions indicated by a syndrome at address positions corresponding one-to-one to the outputs of said syndrome, wherein stored contents of said memory are read out and correction and detection of errors are performed based on the read-out contents.

In a data transmission system such as a main memory device of a data processing system, there has heretofore been adopted a method using a so-called SEC/DED Hamming code, in which automatic correction of 1-bit errors and detection of 2-bit errors are performed. With the recent improvement of the degree of integration in integrated circuit (IC) memory elements, it has been desired to adopt an error correcting code capable of automatic correction of errors of $t$-bits ($t \geq 2$) and detection of errors of ($t+1$)-bits.

As an error correcting code of the desired type, there is known a so-called BCH code. This code and conventional coding methods are detailed in, for example, Miyagawa et al, "Theory of Coding" (published by SHOKODO).

In general, in an error correction control system, code words are produced by adding check bits to information bits on the basis of the above-mentioned code logic, and when using information, syndromes are produced from said code words consisting of the information bits and the check bits added to the information bits. From these syndromes, the number of errors, if any, is known, as well as the position of bits in error or "error bits". Check bits are generated from the information bits through a specified logic circuit (i.e. a check bit generating circuit), according to the above-mentioned code logic. Syndrome signals are also produced from the information bits and check bits through a predetermined syndrome producing circuit.

In one conventional example, the syndrome signals are decoded by the logic circuit so as to determine the existance or no-existance of errors, the number of errors, and the positions of the error bits. In other examples, a shift register is used. However, in a case where errors of more than two bits are to be corrected, there are the disadvantages in that, in the case of the former example, the logic circuits become enormous in number and complicated, and in the case of the other examples (employing shift registers), a long time is required for the processing.

SUMMARY OF THE INVENTION

The primary object of the present invention is to provide an error correction control system for overcoming the above-mentioned drawbacks, in which, in view of the fact that the syndromes and error bit positions can be predicted by the aforementioned code theory, a memory is provided which stores, in memory locations which have addresses corresponding to the syndromes, the error bit position information indicative of the error bit position corresponding to said syndromes, so as to simplify error correcting circuits and speed up the circuit operations for automatic error corrections.

The second object of the present invention is to provide an error correction control system in which, in view of the fact that there is a certain relationship between the syndromes and the error bit position information corresponding to said syndromes only ($t-1$) error bit position information is stored in the memory, the remaining one error bit position information being determined by carrying out exclusive OR operations based on the syndromes and the ($t-1$) error bit position information read from said memory, thus, reducing the required capacity of said memory.

The third object of the present invention is to provide an error correction control system in which errors in the error bit position information itself, stored in the memory, can be detected.

BRIEF DESCRIPTION OF THE DRAWINGS

FIGS. 1 to 4 are diagrams illustrating formation of the check matrix for automatic correction of $t$-bit errors and detection of ($t+1$)-bit errors;

FIG. 6 is a diagram illustrating the relation between addresses and stored contents in the memory used in the present invention;

FIG. 10 shows decoder circuits 8-0, 8-1 of FIG. 7;

FIG. 11 shows the content of the memory 2 in FIG. 8; and

FIG. 12 shows decoder circuits 5A and 5B of FIG. 8.

DETAILED DESCRIPTON OF THE PREFERRED EMBODIMENT

Figure 4:
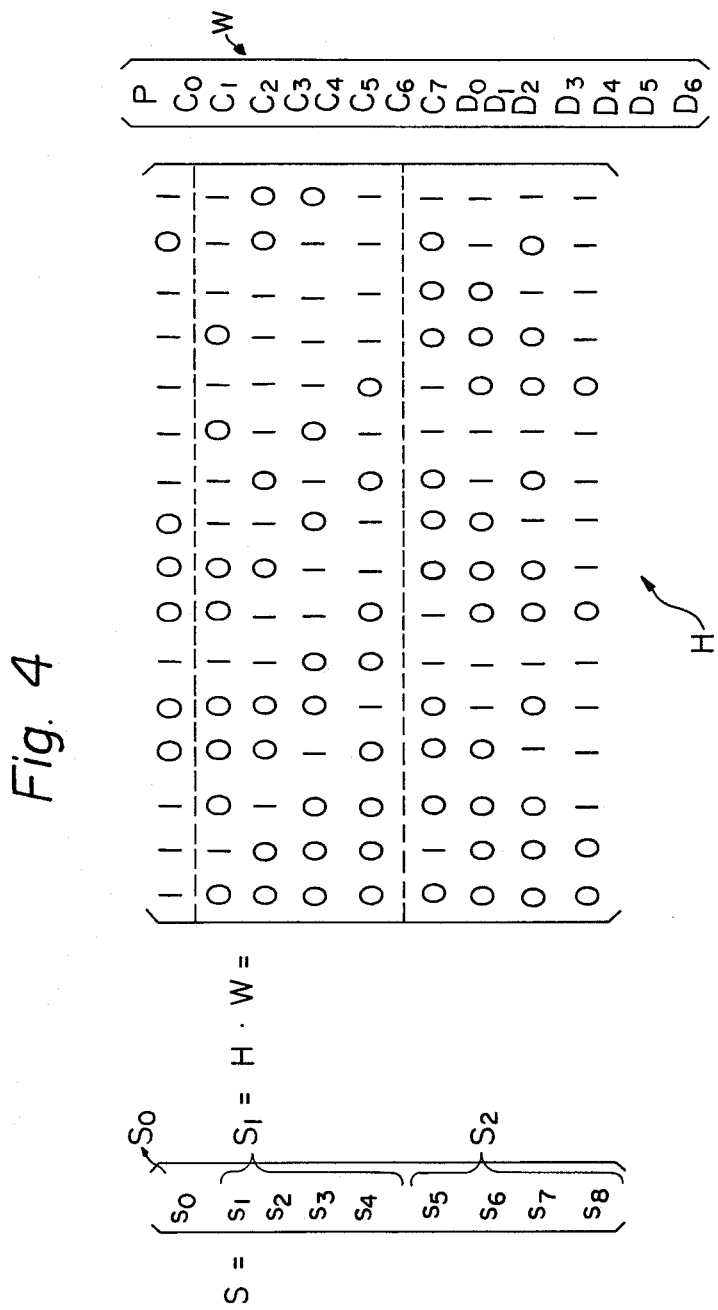

FIGS. 1 to 4 are diagrams illustrating formation of the inspection matrix for automatic correction of $t$-bit errors and detection of ($t+1$)-bit errors.

A BCH code capable of correcting 2-bit random errors, which code has a code word length of 15 bits and an information bit number $k$ of 7, will now be described as an example. The generation polynominal expression of this code is represented by the following equation having as roots $\alpha$ and $\alpha^3$ of Galois function GF ($2^4$):

$$G(x) = (x^4 + x + 1)(x^4 + x^3 + x^2 + x + 1)$$

The inspection matrix H of this code is as shown in FIG. 1.

When code words having errors on the $i$-th bit and the $j$-th bit positions are given to the above inspection matrix H, if the syndrome calculated from the upper half of the inspection matrix H shown in FIG. 1 is designated as $S_1$ and the syndrome calculated from the lower half is designated as $S_2$, the entire syndrome $$(S = \begin{bmatrix} S_1 \\ S_2 \end{bmatrix})$$

is given as follows.

$$S_1 = \alpha^{i-1} + \alpha^{j-1}$$
$$S_2 = \alpha^{3(i-1)} + \alpha^{3(j-1)} \quad \text{(A)}$$

The above formula (A) can be rearranged as follows:

$$\alpha^{i-1} + \alpha^{j-1} = S_1$$
$$\alpha^{i-1}\alpha = S_1^2 + (S_2/S_1)$$ (B)

Accordingly, the positions of the above 2-bit errors are given by solving the following polynominal expression:

$$f(x) = x^2 + S_1 x + [S_1^2 + (S_2/S_1)] = 0$$ (C)

If an error occurs only at one position, since the relation of $S_2 = (S_1)^3$ is established, the error bit position is given by solving the following formula:

$$f(x) = x + S_1 = 0$$

Shift registers and decoders of logic circuits have heretofore been used for determining error bit positions according to the above-mentioned procedures and, therefore, the processing structure has been complicated. It is known that, if one line of parity check for the checking of the total bits is added to the check matrix H shown in FIG. 1, it is possible to detect 3-bit errors. The so-arranged check matrix is shown in FIG. 2. When the check matrix shown in FIG. 2 is employed, detection of the conditions of errors is performed in the following manner.

When code words are given to the inspection matrix H shown in FIG. 2, if the syndrome calculated from the first row is designated as $S_0$, the syndrome calculated from the second row is designated as $S_1$, and the syndrome calculated from the third row is designated as $S_2$, the following relations are established:

(a) When there is no error:
$S_0 = S_1 = S_2 = 0$
(b) In case of 1-bit error:
(i) $S_0 = 1, S_1 = S_2 = 0$
(ii) $S_0 = 1, (S_1)^3 = S_2$
(c) In case of 2-bit errors:
(i) $S_0 = 0, (S_1)^3 \neq S_2$
(ii) $S_0 = 0, (S_1)^3 = S_2$
(d) In case of 3-bit errors:
$S_0 = 1, (S_1)^3 \neq S_2$ By utilizing the foregoing relations, 1-bit and 2-bit errors are automatically corrected, and 3-bit errors are detected.

FIG. 3 illustrates a check matrix H in which $\alpha^i$ is expressed in terms of the vector of the binary value of 4 bits and a parity check of the first row is arranged so that each column takes an odd number of logic "1" values. When the matrix shown in FIG. 3 is employed, the same relations (a) through (d) as explained above with reference to FIG. 2 are established with respect to the syndromes $S_1$ and $S_2$, but a difference is brought about with respect to the syndrome $S_0$. More specifically, in the case where the inspection matrix shown in FIG. 3 is used, what is meant by the fact that $S_0$ is logic "1" and what is meant by the fact that $S_0$ is logic "0" are different from those in the case where the check matrix shown in FIG. 2 is used. Namely, the condition for the syndrome $S_0$ to be logic "0" is that an even number of the 9 digits in a vertical row have the logic value of "1", and the condition for the syndrome $S_0$ to be logic "1" is that an odd number of the 9 digits in a vertical row have the logic value of "1".

The check matrix H shown in FIG. 3 can be used as it appears in the error correcting and controlling system of the present invention as shown in FIG. 4. In general, correction and detection of errors of code words are performed by taking out digits at positions where the value "1" appears, among digits constituting code words with respect to each line of the matrix H, checking parities of these digits, and generating syndrome bits with respect to each row. Accordingly, in the case of a matrix where many positions of each line take the value of "1", such as the check matrix H shown in FIG. 3 or in FIG. 4, the process for generating syndromes and the circuit for this process become complicated.

Figure 5:
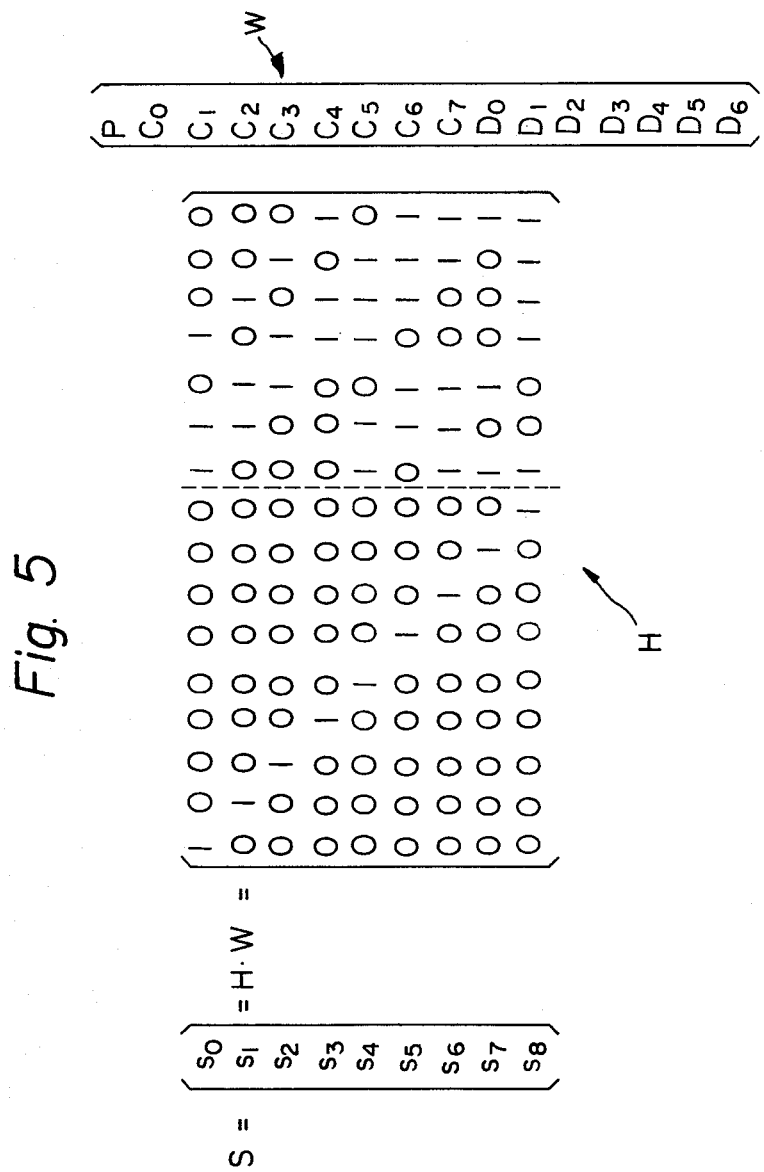
FIG. 5 is a diagram illustrating an embodiment of the processing for obtaining syndromes according to the present invention.

Therefore, in the present invention, a check matrix H as shown in FIG. 5 is advantageously used. The matrix H shown in FIG. 5 is formed by performing addition by modulo 2 in each row and by interchanging lines in the matrix shown in FIG. 3 or in FIG. 4, so that the matrix can be divided into a left unity matrix and a right check matrix.

In the present invention, a memory is used for performing the process of determining error bit positions, so that the processing can be performed by a simple structure whether the check matrix H shown in FIG. 3 or in FIG. 4, or the check matrix H shown in FIG. 5, is employed.

In FIG. 5, when the syndrome S is obtained by applying the check matrix H to the code word, the processing as shown in FIG. 5 is performed. In FIG. 5, symbol H represents an inspection matrix and symbol W denotes a code word which consists of parity bit P, check bits $C_0$ to $C_7$ and data $D_0$ to $D_6$.

In the present invention, a memory is disposed so that error bit position information, showing error bit positions indicated by a certain syndrome S are stored at address positions given by said syndrome S. When a certain syndrome S is given by the processing shown in FIG. 5, the memory is subjected to access, and error bit positions are determined by the stored contents of the memory.

FIG. 6 illustrates the structure of the memory used in the present invention for storing information related to error bit positions. It is possible to calculate, in advance, patterns of the syndrome S resulting from multiplication of the code word W and matrix H. That is, it is possible to calculate what pattern the syndrome S takes, in accordance with the code theory mentioned in a foregoing paragraph, when one error is present at any bit in the code word W, when two errors are present therein, or when errors are present at three or more bits. Based on the results of such calculation, information indicating the error bit position corresponding to a certain syndrome S is stored in the memory.

More specifically, in the embodiment shown in FIG. 6, when syndromes $s_8$ to $s_1$ are given by [00000000], information [00000000] indicating the absence of an error bit is stored at address [00000000] of the memory, and when syndromes $s_8$ to $s_1$ are given by [00000001], information [10000000] indicating the presence of an error at bit $C_0$ is stored at address [00000001] of the memory. Similarly, when syndromes $s_8$ to $s_1$ are given by [00000011], information [10000100] indicating the presence of errors at bits $C_0$ and $C_1$ are stored at address [00000011] of the memory, and when the pattern of syndromes $s_8$ to $s_1$ is one that may not be generated in the case of 1-bit errors or 2-bit errors, for example, [11111110] or [11111111], information [00000000] indicating incapability of determining error bit positions is stored at the corresponding address of the memory.

The memory shown in FIG. 6 is arranged so that the processing corresponding to the syndrome $s_0$ is separately performed in order to reduce the storage capacity of the memory, as detailed hereinafter with reference to FIG. 7. Further, the storage contents of the memory are divided into part A and part B, so that when an error is present only at one bit, the error bit position is expressed by four bits of the part A, and when an error is present at 2 bits, one error bit position is expressed by four bits of the part A and the other error bit position is expressed by four bits of the part B. When no error is present or when errors are present at 3 bits or more, the content of each of the parts A and B is adjusted to zero.

Suppose that pattern [00000011] is given for $s_8$ to $s_1$ of the syndrome S by performing the operation as shown in FIG. 5; then, the address position [00000011] on the memory is subjected to access and the stored content [10000100] is read out. By the content fraction [1000] of the part A of the stored content, the position of the first error bit $C_0$ is extracted, and by the content fraction [0100] of the part B, the position of the second error bit $C_1$ is extracted.

Figure 7:
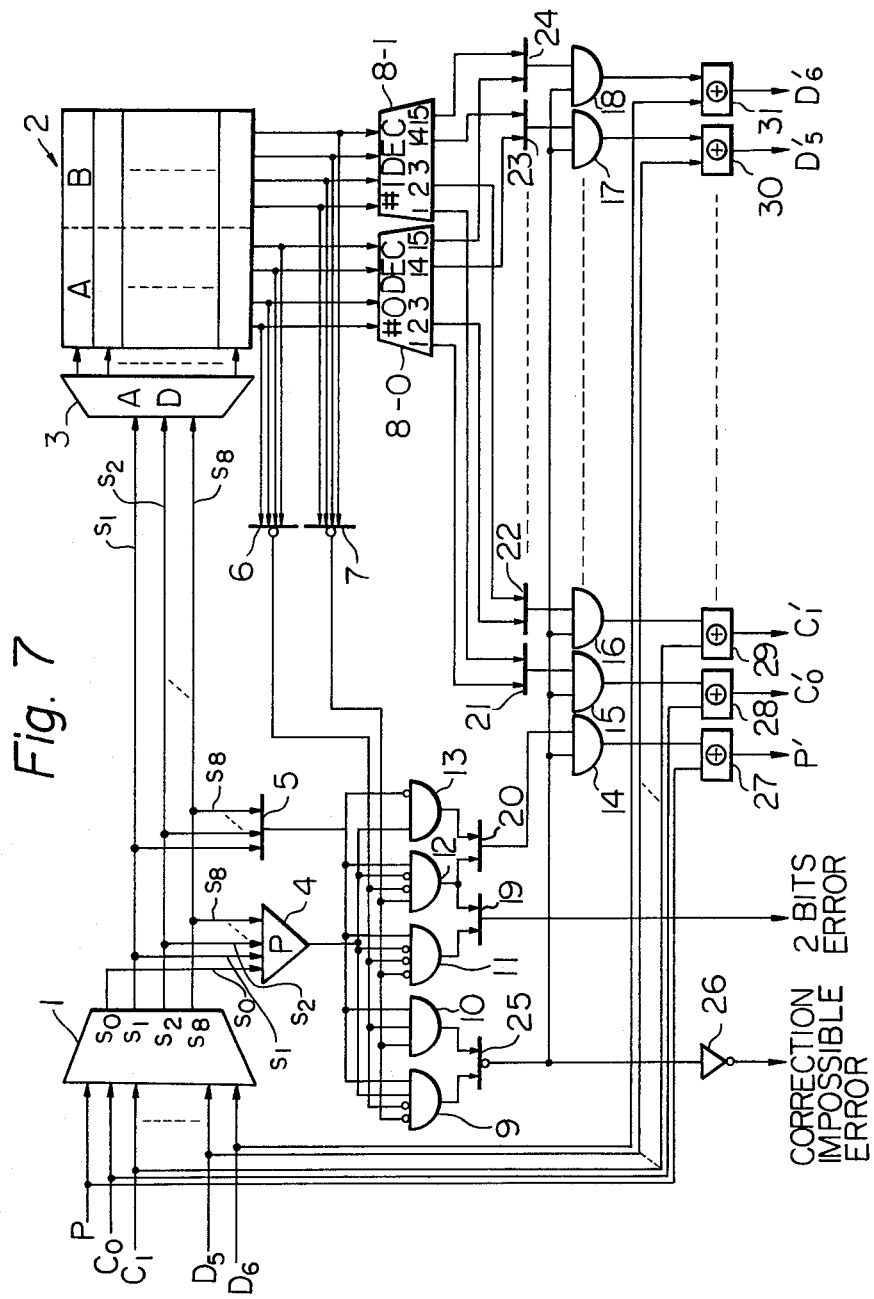
FIGS. 7 through 9 are diagrams illustrating embodiments of the structures of the present invention.

As pointed out hereinbefore with reference to FIG. 6, an example of the structure for performing automatic correction and detection of errors by subjecting the memory to access based on the obtained syndrome S and, thus, determining error bit positions is illustrated in FIG. 7.

In FIG. 7, reference numeral 1 represents syndrome generating means, 2 a read-only memory for storing therein information of error bit positions, 3 an address decoder for decoding contents of $s_8$ to $s_1$ of syndrome S generated by the syndrome generating means 1, and 4 a parity generator for generating logic "1" by utilizing syndromes $s_8$ to $s_1$ and $s_0$ when errors are present at an odd number of bits; 5 represents an OR circuit for generating logic "0" when each of $s_8$ to $s_1$ of the syndrome S has a logic value of "0", 6 a NOR circuit for generating logic "1" when each of the contents of the part A read out from the memory 2 has a logic value of "0", 7 a NOR circuit for generating logic "1" when each of the contents of the part B read out from the memory 2 has a logic value of "0", and 8-0 and 8-1 decoders for decoding the contents of the parts A and B, respectively. Further, reference numerals 9 to 18 represent AND circuits, 19 to 24 OR circuits, 25 a NOR circuit, 26 a NOT circuit, and 27 to 31 exclusive OR circuits. FIG. 10 shows decoder circuits 8-0 and 8-1 of FIG. 7.

(I) The case where an error is caused only at bit $C_1$ among input code words $P_0, C_0, \ldots D_6$ is now explained as an example. In this case, the syndrome generator 1 performs the processing shown in FIG. 5 to give the following syndrome S.

$$S = (s_8, s_7, \ldots s_1, s_0) = (000000100)$$

Thus, $s_8$ to $s_1$ are given as address information to the memory 2, and information [01000000] is read out from the corresponding address positions of the memory 2, as shown in FIG. 6. The content [0100] of the part A is put in the decoder 8-0, and the content [0000] of the part B is put in the decoder 8-1. As a result, the terminal [2] 111 of the decoder 8-0 is made to have a logic value of "1", and each of the terminals [1] and [15] of the decoder 8-1 generates logic "0". At this point, since the NOR circuit 25 generates logic "1" as described hereinafter, logic "1" is given to one of the inputs of the exclusive OR circuit 29 through the OR circuit 22 and AND circuit 16, whereby the content of the bit $C_1$ in the input code word is reversed [P, $C_0$, $\overline{C}_1$, ... $D_6$] is put out as output P', $C_0'$, ... $D_6'$. Namely, the 1-bit error is corrected.

(II) The case where an error is caused only at parity bit P among input code words is now explained. In this case, only syndrome $s_0$ has a logic value of "1". Accordingly, the parity generator 4 has a logic value of "1" and the OR circuit 5 has a logic value of "0", with the result that each of the NOR circuits 6 and 7 has a logic value of "1". Therefore, the AND circuit 13 puts out logic "1", and through the OR circuit 20, AND circuit 14 and exclusive OR circuit 27, only the parity bit P among the input code words is reversed, and [$\overline{P}$, $C_0$, $\overline{C}_1$, ... $D_6$] is put out.

(III) The case where errors are caused at the parity bit P and bit $C_1$ among the input code words is now explained. In this case, the syndrome S obtained is as follows.

$$S = (s_8, s_7, \ldots s_1, s_0) = (000000101)$$

In this case, correction of the error at the bit $C_1$ is performed in the same manner as described above with respect to the case (I). Further, in this case, the parity generator 4 generates logic "0", the OR circuit 5 puts out logic "1", the NOR circuit 6 puts out logic "0" and the NOR circuit 7 puts out logic "1".

As a result, through the AND circuit 12, OR circuit 20, AND circuit 14 and exclusive OR circuit 27, the input parity bit P is reversed, while through OR circuit 22, AND circuit 16, and exclusive OR circuit 29, $C_1$ is reversed, and [$\overline{P}$, $C_0$, $\overline{C}_1$, ... $D_6$] is put out. Moreover, the presence of 2-bit errors is indicated through the OR circuit 19.

(IV) The case where errors are caused at the bits $C_0$ and $C_1$ among the input code words is now explained. In this case, the obtained syndrome S is as follows.

$$S = (s_8, s_7, \ldots s_1 s_0) = (000000110)$$

As will be apparent from FIG. 6, the content [1000] of the part A and the content [0100] of the part B are read out from the memory 2. Accordingly, the terminal [1] of the decoded 8-0 generates logic "1" and the terminal [2] of the decoder 8-1 generates logic "1".

At this point, because of the presence of 2-bit errors, the parity generator 4 puts out logic "0", the OR circuit 5 puts out logic "1", and each of the NOR circuits 6 and 7 puts out logic "0". As a result, the AND circuit 11 is turned on to indicate the presence of 2-bit errors. At this point, since the NOR circuit 25 generates logic "1", through the exclusive OR circuits 28 and 29, the bits $C_0$ and $C_1$ among the input code words are reversed and [P, $\overline{C}_0$, $\overline{C}_1$, ... $D_6$] is put out.

(V) The case where errors are caused at the parity bit P, bit $C_0$ and bit $C_1$ among the input code words is now explained. In this case, the obtained syndrome is as follows.

$$S = (s_8, s_7, \ldots s_1, s_0) = (000000111)$$

In connection with the bits $C_0$ and $C_1$, the correcting processing is started as in the above-mentioned case (IV), and each of the terminal [1] of the decoder 8-0 and the terminal [2] of the decoder 8-1 generates logic "1". At this point, however, since the parity generator 4 generates logic "1", the OR circuit 5 generates logic "1", and each of the NOR circuits 6 and 7 generates logic "0", the AND circuit 9 is turned on, the NOR circuit 25 generates logic "0", and the NOT circuit 26 puts out logic "1", with the result that an indication of "uncorrectable errors" is given. At this point, since the NOR circuit 25 puts out logic "0", each of the AND circuits 14 to 18 is turned off and the exclusive OR circuits 27 to 31 allow the input code words to pass as they are. Accordingly, undesirable correction is not performed at all.

(VI) The case where errors are caused at three bits of $C_0$, $C_1$ and $C_2$ among the input code words is now explained. In this case, the obtained syndrome S is as follows.

$$S = (s_8, s_7, \ldots s_1, s_0) = (000001110)$$

Since this syndrome pattern is one that is not obtained when 1-bit errors or 2-bit errors take place, each of the contents of the parts A and B read out from the memory 2 is [0000] and, therefore, none of the terminals [1] to [15] generates logic "1" in the decoders 8-0 and 8-1.

The parity generator 4 generates logic "1", the OR circuit 5 generates logic "1", and each of the NOR circuits 6 and 7 generates logic "1". As a result, the AND circuit 10 is turned on and an indication of "uncorrectable errors" is given through the NOT circuit 26.

The reason the parity generator 4, OR circuit 5, NOR circuits 6 and 7, and AND circuits 9 to 13, are disposed in the embodiment shown in FIG. 7 is that the necessary storage capacity of the memory 2 is reduced to ½ by treating $s_0$ of the obtained syndrome S separately. More specifically, if all the combination of syndromes $s_8$ to $s_0$ to be generated are taken into consideration, it is necessary to provide $2^9$ addresses in the memory 2. In contrast, if $s_0$ related to the parity bit is treated separately as shown in FIG. 7, $2^8$ addresses are sufficient for the memory 2. Namely, the capacity of the memory 2 can be reduced to ½. This reduction can be accomplished only by provision of the parity generator 4 and the like. Accordingly, the hardware structure can be remarkably simplified.

As will be apparent from the embodiment in FIG. 7, when the read-only memory 2 is used, there is attained an advantage in that the processing for determining error bits can be remarkably simplified. However, when a code word becomes lengthy and check bits increase, there is brought about another defect in that the memory capacity of the read-only memory 2 must be drastically increased.

Figure 8:
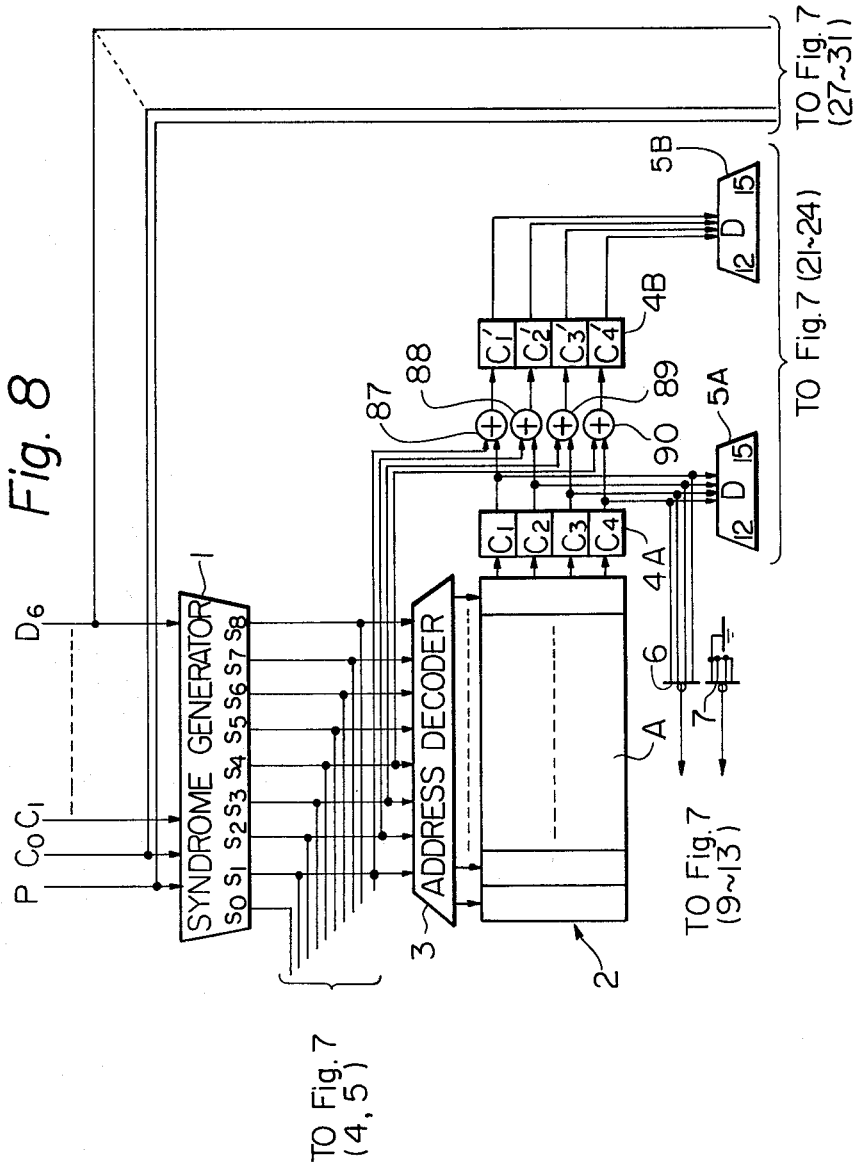

FIG. 8 illustrates one embodiment of the present invention which solves the above mentioned other defect. In FIG. 8, the reference numerals correspond to those in FIG. 7. Reference numerals 87 to 90 are extracting means consisting of exclusive OR circuit, and 4A and 4B are error bit position information registers.

In FIG. 8, the memory 2 is arranged to have a capacity sufficient to store only information of one error bit position, and the remaining one error bit position is extracted by error bit position information extracting means 87 to 90.

IN FIG. 8, when code words W (P $C_0 C_1 \ldots D_6$) are given, the syndrome generator 1 performs the processing as shown in FIG. 4 to generate syndrome $S$ ($s_0, s_1, \ldots s_8$).

In BCH code, as shown in the H matrix of FIG. 2, the value of $\alpha$ is arranged in the order of power in the second row and yet each value appears only once. Therefore, it is possible to display the error bit position in the code word by using a 4 bit vector display portion which corresponds to the portion of the second row in FIG. 2, in the H matrix of FIGS. 3 and 4. If the error bit position is displayed by such a method, when the syndrome S and the error bit position indicated by said syndrome S are examined, it is seen that the following relations are established between them. Namely, if the first error bit information indicated by the syndrome S ($= s_0, s_1, \ldots s_8$) is designated as $d_1$ to $d_4$ and the second error bit information is designated as $d_1'$ to $d_4'$ when there are 2-bit errors among them, the following relations are established.

$$s_1 = d_1 \oplus d_1'$$

$$s_2 = d_2 \oplus d_2'$$

$$s_3 = d_3 \oplus d_3'$$

$$s_4 = d_4 \oplus d_4'$$

where $\oplus$ means addition in modulo-2).

Accordingly, if the syndrome S ($= s_0, s_1, \ldots s_8$) and the first error bit information $d_1$ to $d_4$ are given the second error bit information $d_1'$ to $d_4'$ can be obtained from the following relation formulae.

$$d_1' = s_1 \oplus d_1$$

$$d_2' = s_2 \oplus d_2$$

$$d_3' = s_3 \oplus d_3$$

$$d_4' = s_4 \oplus d_4$$

FIG. 11 shows the content of the memory 2 used in FIG. 8. In FIG. 4, it is understood that the syndromes $s_8 \ldots s_1 = 000 \ldots 01$ are produced at the time of 2-bit errors of the bit $C_5$ and the bit $D_2$. In the address positions 0000 . . . 01 of the memory 2 of FIG. 11, $\alpha^6 = 0110$, which shows that the $C_5$ bit is stored. Likewise, in the address positions 000 . . . 010, $\alpha^5 = 0011$, which shows that the bit $C_6$ is stored out of the bit $C_6$ and the bit $D_3$. Also, in the address positions corresponding to the syndromes of "no errors" and "correction impossible", 0000 is stored in the memory 2 of FIG. 11 as was previously the case in FIG. 6.

In the present invention, by utilizing the foregoing relations, the second error bit position information $d_1$ to $d_4$, is obtained by error bit position information extracting means 87 to 90 (FIG. 8), based on the first error bit position information $d_1'$ to $d_4'$ read out from the memory 2 and the syndromes $s_1$ to $s_4$ from syndrome generator 1. In other words, the second error bit information is set in the register 4B. The contents of the registers 4A and 4B are decoded by the decoders 5A and 5B. FIG. 12 shows the decoders 5A and 5B of FIG. 8 in more detail. For example, when it is decoded that errors are present at bits $C_0$ and $C_1$ among the code words P, $C_0$ . . . $D_6'$ words ($P_1' C_0', \ldots C_5', \ldots D_3' \ldots D_6'$) are put out as corrected code words (P, $C_0 \ldots C_5', \ldots D_3', \ldots D_6$).

If errors are present at bits $C_0'$ and $C_1$ among the code words W(P, $C_0 \ldots D_6$) as pointed out above the syndrome S generated by the syndrome generator 1 is as follows.

$$s_0 = [0]$$

$$s_1 = \begin{bmatrix} 1 \\ 1 \\ 0 \\ 0 \end{bmatrix}$$

$$s_2 = \begin{bmatrix} 1 \\ 0 \\ 0 \\ 1 \end{bmatrix}$$

Further, the first error bit position information read out from the memory 2 is as follows.

$$\begin{bmatrix} d_1 \\ d_2 \\ d_3 \\ d_4 \end{bmatrix} = \begin{bmatrix} 1 \\ 0 \\ 0 \\ 0 \end{bmatrix}$$

Thus, it is confirmed that relations of $s_0 = 0$ and $s_1{}^3 = s_3$ are established and two bit errors are present.

The information extracting means 87 to 90 perform the following operation.

$$\begin{bmatrix} d_1' \\ d_2' \\ d_3' \end{bmatrix} = \begin{bmatrix} s_1 \\ s_2 \\ s_3 \\ s_4 \end{bmatrix} \oplus \begin{bmatrix} d_1 \\ d_2 \\ d_3 \\ d_4 \end{bmatrix}$$

As a result, the following second error bit position information is obtained and set at the register 4B.

$$\begin{bmatrix} d_1' \\ d_2' \\ d_3' \\ d_4' \end{bmatrix} = \begin{bmatrix} 1 \\ 1 \\ 0 \\ 0 \end{bmatrix} \oplus \begin{bmatrix} 1 \\ 0 \\ 0 \\ 0 \end{bmatrix} = \begin{bmatrix} 0 \\ 1 \\ 0 \\ 0 \end{bmatrix}$$

When errors are present at bits $C_0$ and $C_1$ as pointed out above, the second error bit position information $d_1'$ to $d_4'$ is as follows.

$$\begin{bmatrix} d_1' \\ d_2' \\ d_3' \\ d_4' \end{bmatrix} = \begin{bmatrix} 0 \\ 1 \\ 0 \\ 0 \end{bmatrix}$$

It will, therefore, be seen that the content set at the register 4B in FIG. 8 correctly indicates the second error bit information.

As will be apparent from the foregoing illustration, the memory 2 for storing information of error bit positions in the embodiment in FIG. 8 is sufficient if it has a capacity of storing only information of (t-1) error bit positions, and there can be attained an advantage in that the capacity of the memory 2 is reduced to ½ if, for example, correction of 2-bit errors and detection of 3-bit errors are conducted.

As will be apparent from the embodiments in FIG. 7 and FIG. 8, when the read-only memory 2 is used, the processing for determining error bits can be remarkably simplified. However, there is brought about another defect in that when there is a problem in the read-only memory 2 per se, an error will probably be included in the read-out error bit position information.

Figure 9:
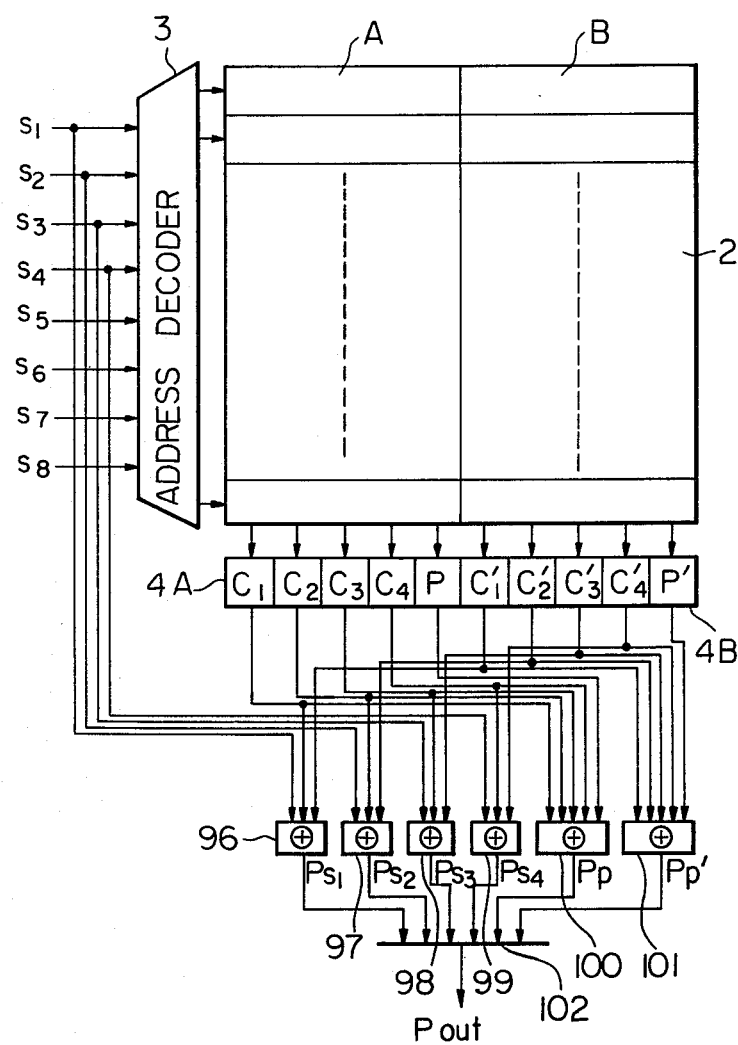

FIG. 9 illustrates the structure of one embodiment of the present invention solving the above-mentioned other defect, in which a parity check function is added to the read-only memory in FIG. 7 and FIG. 8. In FIG. 9, reference numerals A, B, 2, 3, 4A and 4B, represent the same members or units as in FIGS. 7 and 8. Reference numerals 96 to 102 represent a propriety checking circuit according to the present invention, which comprises exclusive OR circuits 96 to 101 and an OR circuit 102. Symbol $P_{out}$ represents a check signal generating logic "0" when the read-out error bit position information includes no errors.

In the embodiment illustrated in FIG. 9, in the memory 2, a parity pit P is added to the part A of the error bit position information and a parity bit P' is added to the part B of the error bit position information, so that when an error of 1-bit is caused in each part, the error is detected. However, if errors of 2-bits are caused in either of the two parts, or in both parts, detection of the errors is impossible.

In order to solve the above-mentioned detection problem, in the embodiment of FIG. 9, the relation between the syndrome S obtained by the processing shown in FIG. 4 and the error bit position indicated by the syndrome S is examined and utilized for correction and detection of errors. More specifically, when there are 2-bit errors present, the following relations are established between outputs of the syndrome S ($=s_0, s_1, \ldots, s_8$) obtained by the processing shown in FIG. 4 and error bit information $d_1$ to $d_4$ and $d_1'$ to $d_4'$ stored in th memory 2.

$$S_1 = d_1 \oplus d_1'$$

$$S_2 = d_2 \oplus d_2'$$

$$S_3 = d_3 \oplus d_3'$$

$$S_4 = d_4 \oplus d_4'$$

Further, the following relations are established between the parity bits P and P' and the information $d_1$ to $d_4$ and $d_1'$ to $d_4'$.

$$P = d_1 \oplus d_2 \oplus d_3 \oplus d_4$$

$$P' = d_1' \oplus d_2' \oplus d_3' \oplus d_4'$$

If the following formulae are calculated in view of the foregoing relations, it is seen that each of the outputs $Ps_1$ to $Pp'$ must have a logic value of "0".

$$Ps_1 = s_1 \oplus d_1 \oplus d_1'$$

$$Ps_2 = s_2 \oplus d_2 \oplus d_2'$$

$$Ps_3 = s_3 \oplus d_3 \oplus d_3'$$

$$Ps_4 = s_4 \oplus d_4 \oplus d_4'$$

$$Pp = P \oplus d_1 \oplus d_2 \oplus d_3 \oplus d_4$$

$$Pp' = P' \oplus d_1' \oplus d_2' \oplus d_3' \oplus d_4'$$

If an error is present in any of the read-out information contents of $d_1$ to $d_4$, P, $d_1'$ to $d_4'$ and P', one of the outputs $Ps_1$ to $Pp'$ must have a logic value of "1". Accordingly, exclusive OR circuits 96 to 101 shown in FIG. 9 are arranged so that when outputs $Ps_1$ and $Pp'$ are examined and it is found that one of these outputs has a logic value of "1", logic "1" is put out as the output $P_{out}$.

For example, when errors are present at bits $C_0$ and $C_1'$ among the code words W in FIG. 4, as described above, the syndrome obtained by the processing shown in FIG. 9 is as follows.

$$S_0 = [0]$$

$$S_1 = \begin{bmatrix} 1 \\ 1 \\ 0 \\ 0 \end{bmatrix}$$

$$S_2 = \begin{bmatrix} 1 \\ 0 \\ 0 \\ 1 \end{bmatrix}$$

Further the parts A and B of the error bit position information have the following contents, respectively.

$$\begin{bmatrix} d_1 \\ d_2 \\ d_3 \\ d_4 \end{bmatrix} = \begin{bmatrix} 1 \\ 0 \\ 0 \\ 0 \end{bmatrix} \text{ and } \begin{bmatrix} d_1' \\ d_2' \\ d_3' \\ d_4' \end{bmatrix} = \begin{bmatrix} 0 \\ 1 \\ 0 \\ 0 \end{bmatrix}$$

From the above results, there are obtained the relations of $S_0 = 0$ and $S_1^3 \neq S_3$, and the presence of 2-bit errors is detected.

(1) If the contents of $C_1$ to $C_4$, P, $C_1'$ to $C_4'$ and P' of the error bit information read out from the memory 2 are correct, the following relation is established.

$$\begin{bmatrix} s_1 \\ s_2 \\ s_3 \\ s_4 \end{bmatrix} \oplus \begin{bmatrix} d_1 \\ d_2 \\ d_3 \\ d_4 \end{bmatrix} \oplus \begin{bmatrix} d_1' \\ d_2' \\ d_3' \\ d_4' \end{bmatrix} = \begin{bmatrix} 1 \\ 1 \\ 0 \\ 0 \end{bmatrix} \oplus \begin{bmatrix} 1 \\ 0 \\ 0 \\ 0 \end{bmatrix} \oplus \begin{bmatrix} 0 \\ 1 \\ 0 \\ 0 \end{bmatrix} = \begin{bmatrix} 0 \\ 0 \\ 0 \\ 0 \end{bmatrix}$$

Accordingly, logic "0" is put out as the output $P_{out}$.

(II) If there is an error at an optional bit of the contents of parts A and B, needless to say, logic "1" is put out as the output $P_{out}$.

(III) Suppose that an error appears on each of bits $d_2$ and $d_3$, then the contents of $C_1$ to $C_4$, which are predetermined to be:

$$\begin{bmatrix} d_1 \\ d_2 \\ d_3 \\ d_4 \end{bmatrix} = \begin{bmatrix} 1 \\ 0 \\ 0 \\ 0 \end{bmatrix}$$

are changed to:

$$\begin{bmatrix} d_1 \\ d_2 \\ d_3 \\ d_4 \end{bmatrix} = \begin{bmatrix} 1 \\ 1 \\ 1 \\ 0 \end{bmatrix}$$

In this case, there is no change caused on the parity bit P and, therefore, the above errors cannot be detected by the parity bits alone.

However, in the present invention, the following relation is established.

$$\begin{bmatrix} s_1 \\ s_2 \\ s_3 \\ s_4 \end{bmatrix} \oplus \begin{bmatrix} d_1 \\ d_2 \\ d_3 \\ d_4 \end{bmatrix} \oplus \begin{bmatrix} d_1' \\ d_2' \\ d_3' \\ d_4' \end{bmatrix} = \begin{bmatrix} 1 \\ 1 \\ 0 \\ 0 \end{bmatrix} \oplus \begin{bmatrix} 1 \\ 1 \\ 1 \\ 0 \end{bmatrix} \oplus \begin{bmatrix} 0 \\ 1 \\ 0 \\ 0 \end{bmatrix} = \begin{bmatrix} 0 \\ 1 \\ 1 \\ 0 \end{bmatrix}$$

Thus, the outputs $Ps_2$, $Ps_3$ have a logic value of "1" and respectively, and logic "1" is put out as the output $P_{out}$.

As will be apparent from the embodiment in FIG. 9, in the present invention, since the memory 2 is used, determination of error bit positions can be performed very simply and occurrence of an error on the error bit position information by a problem in the memory 2 per se can be checked.

The embodiment of automatic correction of 2-bit errors and detection of 3-bit errors has been illustrated hereinbefore but, needless to say, the present invention, in general, is applicable to automatic correction of random $t$-bit errors and detection of $(t+1)$-bit errors.

What is claimed is:

1. In an error correcting and controlling system in which an error check bit for correcting random $t$-bit errors ($t \geq 2$) and detecting $(t+1)$-bit errors is added to data, and in utilizing said data, $t$-bit errors are automatically corrected based on said data and said added error check bit and $(t+1)$-bit errors are similarly detected, said error correcting and controlling system comprises:
   syndrome generating means for generating syndrome outputs of said data,
   a memory for storing encoded error bit position information at address positions corresponding one-to-one to a portion only of the outputs of said syndrome generating means,
   addressing means responsive to said syndrome outputs of said syndrome generating means for addressing said memory to read out said bit position information corresponding to said syndrome outputs, and
   processing means for processing said syndrome outputs and said encoded error bit position information read out from said memory so as to decode the latter, to identify errors in said data, and to modify said data, whereby detection and correction of errors of said data are performed based on the stored contents of said memory.

2. In an error correcting and controlling system as set forth in claim 1, wherein said encoded error bit position information stored in said memory comprises a first portion indicating the identity, if any, of a first error, and a second portion indicating the identity, if any, of a second error, said system including first and second detecting means for detecting when said first and second portions, respectively, indicate absence of said first and second errors, respectively.

3. In an error correcting and controlling system as set forth in claim 1, wherein said encoded error bit position information stored in said memory comprises a first portion indicating the identity, if any, of a first error, and a second portion indicating the identity, if any, of a second error, said system including first and second decoding means for decoding the contents of said first and second portions, respectively, of said memory so as to provide an output identifying the presence, if any, of said first and second errors, respectively.

4. In an error correcting and controllng system in which an error check bit for correcting random $t$-bit errors ($t \geq 2$) and detecting ($t+1$)-bit errors is added to data, and in utilizing said data, $t$-bit errors are automatically corrected based on said data and said added error check bit and ($t+1$)-bit errors are similarly detected, said error correcting and controlling system comprises:
   syndrome generating means for generating syndrome outputs of said data,
   a memory for storing encoded error bit position information at address positions corresponding one-to-one to a portion only of the outputs of said syndrome generating means,
   addressing means responsive to said syndrome outputs of said syndrome generating means for addressing said memory to read out said bit position information corresponding to said syndrome outputs, and
   processing means for processing said syndrome outputs and said encoded error bit position information read out from said memory so as to decode the latter, to identify errors in said data, and to modify said data, whereby detection and correction of errors of said data are performed based on the stored contents of said memory;
   wherein encoded ($t-1$) error bit position information representative of error bit positions corresponding to the syndrome outputs of said syndrome generating means is stored in said memory, and said system further comprises encoded error bit position information generating means for generating the remaining one error bit position information based on said ($t-1$) error bit position information read from said memory and for carrying out the error bit correction by processing said encoded ($t-1$) error bit position information read out from said memory and said remaining one error bit position generated by said generating means.

5. In an error correcting and controlling system as set forth in claim 4, wherein said encoded error bit information generating means comprises:
   a first register for holding said encoded ($t-1$) error bit position information read from said memory indicating a first error in this data,
   error bit position information extracting means for processing said encoded ($t-1$) error bit position information and said syndrome outputs from said syndrome generating means to develop information indicating a second error in said data, and
   a second register for holding said information indicating said second error in said data.

6. In an error correcting and controlling system as set forth in claim 5, wherein said system further comprises first and second decoding means connected to said first and second registers, respectively, for decoding said information indicating said first and second errors, respectively, and providing corresponding first and second decoder outputs for detection and correction of errors of said data.

7. In an error correcting and controlling system in which an error check bit for correcting random $t$-bit errors ($t \geq 2$) and detecting ($t+1$)-bit errors is added to data, and in utilizing said data, $t$-bit errors are automatically corrected based on said data and said added error check bit and ($t+1$)-bit errors are similarly detected, said error correcting and controlling system comprises:
   syndrome generating means for generating syndrome outputs of said data,
   a memory for storing encoded error bit position information at address positions corresponding one-to-one to a portion only of the outputs of said syndrome generating means,
   addressing means responsive to said syndrome outputs of said syndrome generating means for addressing said memory to read out said bit position information corresponding to said syndrome outputs, and
   processing means for processing said syndrome outputs and said encoded error bit position information read out from said memory so as to decode the latter, to identify errors in said data, and to modify said data, whereby detection and correction of errors of said data are performed based on the stored contents of said memory;
   wherein the system comprises a propriety check circuit connected to said syndrome generating means and said memory for checking whether or not a predetermined relationship exists between said error bit position information read from said memory and said syndrome produced by said syndrome generating means, whereby the error bit position information read from said memory is determined.

8. An error correcting and controlling system for detecting random ($t+1$)-bit errors and correcting random $t$-bit errors in data supplied thereto, said system comprising:
   syndrome generating means responsive to said data for generating syndrome outputs in accordance with said data and with a syndrome inspection matrix characterizing said syndrome generating means;
   memory means for holding a plurality of encoded error bit position data, each encoded error bit position data corresponding to a respective one of said syndrome outputs, said memory means being addressably responsive to each respective one of said syndrome outputs for reading out said corresponding error bit position data; and
   processing means responsive to each respective one of said syndrome outputs and to said corresponding encoded error bit position data for processing same to detect said ($t+1$)-bit error in said data, and to correct said $t$-bit error in said data.

9. An error correcting and controlling system as set forth in claim 8, wherein said encoded error bit position information stored in said memory comprises a first portion indicating the identity, if any, of a first error, and a second portion indicating the identity, if any, of a second error, said processing means including first and second detecting means for detecting when said first and second portions, respectively, indicate absence of said first and second errors, respectively.

10. An error correcting and controlling system as set forth in claim 8, wherein said encoded error bit position information stored in said memory comprises a first portion indicating the identity, if any, of a first error, and a second portion indicating the identity, if any, of a second error, said processing means including first and second decoding means for decoding the contents of said first and second portions, respectively, of said memory so as to provide an output identifying the presence, if any, of said first and second errors, respectively.

11. An error correcting and controlling system for detecting random $(t+1)$-bit errors and correcting random $t$-bit errors in data supplied thereto, said system comprising:

syndrome generating means responsive to said data for generating syndrome outputs in accordance with said data and with a syndrome inspection matrix characterizing said syndrome generating means;

memory means for holding a plurality of encoded error bit position data, each encoded error bit position data corresponding to a respective one of said syndrome outputs, said memory means being addressably responsive to each respective one of said syndrome outputs for reading out said corresponding error bit position data; and processing means responsive to each respective one of said syndrome outputs and to said corresponding encoded error bit position data for processing same to detect said $(t+1)$-bit error in said data, and to correct said $t$-bit error in said data;

wherein said memory means stores all encoded error bit position information except for a remaining one of said error bit position information, said system including error bit position information generating means for generating the remaining one of said error bit position information from that encoded error bit position information read from said memory means so as to derive all of said encoded error bit position information for detection and correction of said data.

12. An error correcting and controlling system for detecting random $(t+1)$-bit errors and correcting random $t$-bit errors in data supplied thereto, said system comprising:

syndrome generating means responsive to said data for generating syndrome outputs in accordance with said data and with a syndrome inspection matrix characterizing said syndrome generating means;

memory means for holding a plurality of encoded error bit position data, each encoded error bit position data corresponding to a respective one of said syndrome outputs, said memory means geing addressably responsive to each respective one of said syndrome outputs for reading out said corresponding error bit position data; and processing means responsive to each respective one of said syndrome outputs and to said corresponding encoded error bit position data for processing same to detect said $(t+1)$-bit error in said data, and to correct said $t$-bit error in said data;

said system including check circuit means connected to said syndrome generating means and to said memory means for checking whether or not a predetermined relationship exists between said encoded error bit position information read from said memory means and said syndrome produced by said syndrome generating means, whereby the encoded error bit position information read from said memory means is determined and any error bits are corrected.

* * * * *

UNITED STATES PATENT AND TRADEMARK OFFICE
CERTIFICATE OF CORRECTION

PATENT NO. : 4,107,652
DATED : August 15, 1978
INVENTOR(S) : Jun'ichi Tanahashi et al It is certified that error appears in the above-identified patent and that said Letters Patent are hereby corrected as shown below:

Column 1, line 50, "existance" should be --existence--.
Column 1, line 50, "no-existance" should be --non-existence--.
Column 3, line 5, "$a^{i-1}a=S_1^2+(S_2/S_1)$" should be --$a^{i-1}a^{j-1}=S_1^2+\dfrac{S_2}{S_1}$--.
Column 6, line 40, "$S_1S_0$" should be --$S_1$, $S_0$--.
Column 8, line 26, before "where" insert --(--.
Column 9, line 35, "$\begin{bmatrix} d'_1 \\ d'_2 \\ d'_4 \end{bmatrix}$" should be --$\begin{bmatrix} d_1' \\ d_2' \\ d_3' \\ d_4' \end{bmatrix}$--
Column 10, line 21, "pit" should be --bit--.
Column 11, line 8, "theoutput" should be --the output--.

UNITED STATES PATENT AND TRADEMARK OFFICE
CERTIFICATE OF CORRECTION

PATENT NO. : 4,107,652

DATED : August 15, 1978

INVENTOR(S) : Jun'ichi Tanahashi et al

It is certified that error appears in the above-identified patent and that said Letters Patent are hereby corrected as shown below:

Column 11, line 50, "$\begin{bmatrix} d' \\ d'd'_{23} \\ d'_4 \end{bmatrix}$" should be --$\begin{bmatrix} d_1' \\ d_2' \\ d_3' \\ d_4' \end{bmatrix}$--.

Column 16, line 16, "qeing" should be --being--.

*Signed and Sealed this*

*Twenty-seventh* Day of *March 1979*

[SEAL]

Attest:

RUTH C. MASON
*Attesting Officer*

DONALD W. BANNER
*Commissioner of Patents and Trademarks*